United States Patent
Fagg

(10) Patent No.: US 8,254,595 B2
(45) Date of Patent: Aug. 28, 2012

(54) SYSTEM AND METHOD OF COMPANDING AN INPUT SIGNAL OF AN ENERGY DETECTING RECEIVER

(75) Inventor: Russell John Fagg, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 1176 days.

(21) Appl. No.: 12/055,077

(22) Filed: Mar. 25, 2008

(65) Prior Publication Data

US 2009/0243699 A1    Oct. 1, 2009

(51) Int. Cl.
H03G 7/00 (2006.01)
H03B 29/00 (2006.01)

(52) U.S. Cl. .................... 381/106; 381/71.14
(58) Field of Classification Search ........... 381/71.1, 381/71.14, 106, 120
See application file for complete search history.

(56) References Cited

U.S. PATENT DOCUMENTS

| | | |
|---|---|---|
| 4,716,316 A | 12/1987 | Colin |
| 4,730,165 A | 3/1988 | Nishino et al. |
| 5,126,846 A | 6/1992 | Niimura |
| 5,278,912 A | 1/1994 | Waldhauer |
| 5,687,169 A | 11/1997 | Fullerton |
| 5,764,696 A | 6/1998 | Barnes et al. |
| 5,812,081 A | 9/1998 | Fullerton |
| 5,832,035 A | 11/1998 | Fullerton |
| 5,907,427 A | 5/1999 | Scalora et al. |
| 5,952,956 A | 9/1999 | Fullerton |
| 5,960,031 A | 9/1999 | Fullerton et al. |
| 5,963,581 A | 10/1999 | Fullerton et al. |
| 5,969,663 A | 10/1999 | Fullerton et al. |
| 5,995,534 A | 11/1999 | Fullerton et al. |
| 6,031,862 A | 2/2000 | Fullerton et al. |
| 6,091,374 A | 7/2000 | Barnes |
| 6,111,536 A | 8/2000 | Richards et al. |
| 6,133,876 A | 10/2000 | Fullerton et al. |
| 6,177,903 B1 | 1/2001 | Fullerton et al. |

(Continued)

FOREIGN PATENT DOCUMENTS

EP    0479213 A2    4/1992

(Continued)

OTHER PUBLICATIONS

Taiwan Search Report—TW097122905—TIPO—Jan. 11, 2012.

(Continued)

Primary Examiner — Calvin Lee
(74) Attorney, Agent, or Firm — Dang M. Vo; Paul S. Holdaway

(57) ABSTRACT

An apparatus configured as a compandor to achieve a defined dynamic range for an output signal in response to an input signal. In particular, the apparatus comprises a first circuit adapted to generate a first signal from the input signal, wherein the first signal includes a first dynamic range (e.g., a first sensitivity and first compression point); and a second circuit adapted to generate a second signal from the input signal, wherein the second signal includes a second dynamic range (e.g., a second sensitivity and second compression point) that is different from the first dynamic range of the first signal. The apparatus may further include a third circuit adapted to generate an output signal related to a sum of the first and second signals. By adjusting the first and second dynamic ranges, an overall dynamic range for the output signal of the companding apparatus may be achieved.

34 Claims, 6 Drawing Sheets

U.S. PATENT DOCUMENTS

| | | |
|---|---|---|
| 6,218,979 B1 | 4/2001 | Barnes et al. |
| 6,295,019 B1 | 9/2001 | Richards et al. |
| 6,297,773 B1 | 10/2001 | Fullerton et al. |
| 6,300,903 B1 | 10/2001 | Richards et al. |
| 6,304,623 B1 | 10/2001 | Richards et al. |
| 6,351,652 B1 | 2/2002 | Finn et al. |
| 6,354,946 B1 | 3/2002 | Finn |
| 6,400,307 B2 | 6/2002 | Fullerton et al. |
| 6,400,329 B1 | 6/2002 | Barnes |
| 6,421,389 B1 | 7/2002 | Jett et al. |
| 6,430,208 B1 | 8/2002 | Fullerton et al. |
| 6,437,756 B1 | 8/2002 | Schantz |
| 6,462,701 B1 | 10/2002 | Finn |
| 6,466,125 B1 | 10/2002 | Richards et al. |
| 6,469,628 B1 | 10/2002 | Richards et al. |
| 6,483,461 B1 | 11/2002 | Matheney et al. |
| 6,489,893 B1 | 12/2002 | Richards et al. |
| 6,492,904 B2 | 12/2002 | Richards |
| 6,492,906 B1 | 12/2002 | Richards et al. |
| 6,501,393 B1 | 12/2002 | Richards et al. |
| 6,504,483 B1 | 1/2003 | Richards et al. |
| 6,512,455 B2 | 1/2003 | Finn et al. |
| 6,512,488 B2 | 1/2003 | Schantz |
| 6,519,464 B1 | 2/2003 | Santhoff et al. |
| 6,529,568 B1 | 3/2003 | Richards et al. |
| 6,538,615 B1 | 3/2003 | Schantz |
| 6,539,213 B1 | 3/2003 | Richards et al. |
| 6,549,567 B1 | 4/2003 | Fullerton |
| 6,552,677 B2 | 4/2003 | Barnes et al. |
| 6,556,621 B1 | 4/2003 | Richards et al. |
| 6,560,463 B1 | 5/2003 | Santhoff |
| 6,571,089 B1 | 5/2003 | Richards et al. |
| 6,573,857 B2 | 6/2003 | Fullerton et al. |
| 6,577,691 B2 | 6/2003 | Richards et al. |
| 6,585,597 B2 | 7/2003 | Finn |
| 6,593,886 B2 | 7/2003 | Schantz |
| 6,606,051 B1 | 8/2003 | Fullerton et al. |
| 6,611,234 B2 | 8/2003 | Fullerton et al. |
| 6,614,384 B2 | 9/2003 | Hall et al. |
| 6,621,462 B2 | 9/2003 | Barnes |
| 6,636,566 B1 | 10/2003 | Roberts et al. |
| 6,636,567 B1 | 10/2003 | Roberts et al. |
| 6,636,573 B2 | 10/2003 | Richards et al. |
| 6,642,903 B2 | 11/2003 | Schantz |
| 6,661,342 B2 | 12/2003 | Hall et al. |
| 6,667,724 B2 | 12/2003 | Barnes et al. |
| 6,670,909 B2 | 12/2003 | Kim |
| 6,671,310 B1 | 12/2003 | Richards et al. |
| 6,674,396 B2 | 1/2004 | Richards et al. |
| 6,677,796 B2 | 1/2004 | Brethour et al. |
| 6,700,538 B1 | 3/2004 | Richards |
| 6,710,736 B2 | 3/2004 | Fullerton et al. |
| 6,717,992 B2 | 4/2004 | Cowie et al. |
| 6,748,040 B1 | 6/2004 | Johnson et al. |
| 6,750,757 B1 | 6/2004 | Gabig, Jr. et al. |
| 6,759,948 B2 | 7/2004 | Grisham et al. |
| 6,760,387 B2 | 7/2004 | Langford et al. |
| 6,762,712 B2 | 7/2004 | Kim |
| 6,763,057 B1 | 7/2004 | Fullerton et al. |
| 6,763,282 B2 | 7/2004 | Glenn et al. |
| 6,774,846 B2 | 8/2004 | Fullerton et al. |
| 6,774,859 B2 | 8/2004 | Schantz et al. |
| 6,778,603 B1 | 8/2004 | Fullerton et al. |
| 6,781,530 B2 | 8/2004 | Moore |
| 6,782,048 B2 | 8/2004 | Santhoff |
| 6,788,730 B1 | 9/2004 | Richards et al. |
| 6,822,604 B2 | 11/2004 | Schantz et al. |
| 6,823,022 B1 | 11/2004 | Fullerton et al. |
| 6,836,223 B2 | 12/2004 | Moore |
| 6,836,226 B2 | 12/2004 | Moore |
| 6,845,253 B1 | 1/2005 | Schantz |
| 6,847,675 B2 | 1/2005 | Fullerton et al. |
| 6,879,878 B2 | 4/2005 | Glenn et al. |
| 6,882,301 B2 | 4/2005 | Fullerton |
| 6,895,034 B2 | 5/2005 | Nunally et al. |
| 6,900,732 B2 | 5/2005 | Richards |
| 6,906,625 B1 | 6/2005 | Taylor et al. |
| 6,907,244 B2 | 6/2005 | Santhoff et al. |
| 6,912,240 B2 | 6/2005 | Kumar et al. |
| 6,914,949 B2 | 7/2005 | Richards et al. |
| 6,917,284 B2 | 7/2005 | Grisham et al. |
| 6,919,838 B2 | 7/2005 | Santhoff |
| 6,922,166 B2 | 7/2005 | Richards et al. |
| 6,922,177 B2 | 7/2005 | Barnes et al. |
| 6,925,109 B2 | 8/2005 | Richards et al. |
| 6,933,882 B2 | 8/2005 | Fullerton |
| 6,937,639 B2 | 8/2005 | Pendergrass et al. |
| 6,937,663 B2 | 8/2005 | Jett et al. |
| 6,937,667 B1 | 8/2005 | Fullerton et al. |
| 6,937,674 B2 | 8/2005 | Santhoff et al. |
| 6,947,492 B2 | 9/2005 | Santhoff et al. |
| 6,950,485 B2 | 9/2005 | Richards et al. |
| 6,954,480 B2 | 10/2005 | Richards et al. |
| 6,959,031 B2 | 10/2005 | Haynes et al. |
| 6,959,032 B1 | 10/2005 | Richards et al. |
| 6,963,727 B2 | 11/2005 | Shreve |
| 6,980,613 B2 | 12/2005 | Krivokapic |
| 6,989,751 B2 | 1/2006 | Richards |
| 7,015,793 B2 | 3/2006 | Gabig, Jr. et al. |
| 7,020,224 B2 | 3/2006 | Krivokapic |
| 7,027,425 B1 | 4/2006 | Fullerton et al. |
| 7,027,483 B2 | 4/2006 | Santhoff et al. |
| 7,027,493 B2 | 4/2006 | Richards |
| 7,030,806 B2 | 4/2006 | Fullerton |
| 7,042,417 B2 | 5/2006 | Santhoff et al. |
| 7,046,187 B2 | 5/2006 | Fullerton et al. |
| 7,046,618 B2 | 5/2006 | Santhoff et al. |
| 7,069,111 B2 | 6/2006 | Glenn et al. |
| 7,075,476 B2 | 7/2006 | Kim |
| 7,079,827 B2 | 7/2006 | Richards et al. |
| 7,099,367 B2 | 8/2006 | Richards et al. |
| 7,099,368 B2 | 8/2006 | Santhoff et al. |
| 7,129,886 B2 | 10/2006 | Hall et al. |
| 7,132,975 B2 | 11/2006 | Fullerton et al. |
| 7,145,954 B1 | 12/2006 | Pendergrass et al. |
| 7,148,791 B2 | 12/2006 | Grisham et al. |
| 7,151,490 B2 | 12/2006 | Richards |
| 7,167,525 B2 | 1/2007 | Santhoff et al. |
| 7,170,408 B2 | 1/2007 | Taylor et al. |
| 7,184,938 B1 | 2/2007 | Lansford et al. |
| 7,190,722 B2 | 3/2007 | Lakkis et al. |
| 7,190,729 B2 | 3/2007 | Siwiak |
| 7,206,334 B2 | 4/2007 | Siwiak |
| 7,209,724 B2 | 4/2007 | Richards et al. |
| 7,230,980 B2 | 6/2007 | Langford et al. |
| 7,239,277 B2 | 7/2007 | Fullerton et al. |
| RE39,759 E | 8/2007 | Fullerton |
| 7,256,727 B2 | 8/2007 | Fullerton et al. |
| 7,271,779 B2 | 9/2007 | Hertel |
| 8,085,943 B2 * | 12/2011 | Bizjak ........................ 381/71.14 |

FOREIGN PATENT DOCUMENTS

| | | |
|---|---|---|
| JP | 2007552 A | 1/1990 |
| JP | 11271367 A | 10/1999 |
| JP | 2001332946 A | 11/2001 |
| JP | 2002524898 A | 8/2002 |

OTHER PUBLICATIONS

International Preliminary Report on Patentability—PCT/US2008/058513, The International Bureau of WIPO—Geneva, Switzerland, Oct. 11, 2010.

International Search Report and the Written Opinion—PCT/US2008/058513, International Search Authority—European Patent Office -.

* cited by examiner

SYSTEM AND METHOD OF COMPANDING AN INPUT SIGNAL OF AN ENERGY DETECTING RECEIVER

BACKGROUND

1. Field

The present disclosure relates generally to communications systems, and more specifically, to system and method of companding an input signal of an energy detecting receiver.

2. Background

Communications devices that operate on limited power supplies, such as batteries, typically use techniques to provide the intended functionality while consuming relatively small amounts of power. One technique that has been gaining in popularity relates to receiving signals using pulse modulation techniques. This technique generally involves receiving information using low duty cycle pulses and operating in a low power mode during times when not receiving the pulses. Thus, in these devices, the power efficiency is typically better than communications devices that continuously operate a receiver.

Usually, energy detecting receivers are employed when using pulse modulation techniques. In such receiver, the input signal is typically applied to a non-linear device, such as a substantially squaring device, in order to detect the incoming pulses. However, the non-linear or squaring device generally increases the dynamic range of the input signal by a factor of two (2) as measured in decibels (dB). Because of the substantial increase in the dynamic range of the input signal, the power level of the input signal should be controlled in order to prevent compression or, conversely, falling below the sensitivity of subsequent receiving stages.

In the past, automatic gain circuits (AGC) have been employed in order to address the relatively large dynamic range of the input signal generated at the output of the non-linear or squaring device. In such application, the AGC circuit is configured to partition the dynamic range into several overlapping windows, and requires sophisticated and fast circuitry to maintain the received signal level within the proper window. For instance, if the wrong window is selected for the instantaneous level of the received signal, then information may be lost by either the receiver going into compression or conversely dropping below the receiver's sensitivity. Further to the speed and accuracy requirements of the AGC circuit, there is the requirement of the overlapping windows. To minimize overlap and therefore the number of AGC windows, tight receiver gain tolerances are typically required, which leads to complex, costly, and power consuming circuits.

SUMMARY

An aspect of the disclosure relates to an apparatus that may be configured as a compandor to achieve a defined dynamic range for an output signal from an input signal. In particular, the apparatus comprises a first circuit adapted to generate a first signal from an input signal, wherein the first signal includes a first dynamic range; and a second circuit adapted to generate a second signal from the input signal, wherein the second signal includes a second dynamic range that is different from the first dynamic range of the first signal. In another aspect, the apparatus may comprise a third circuit adapted to generate an output signal related to a sum of the first and second signals. By adjusting the first and second dynamic ranges, an overall dynamic range for the output signal of the companding apparatus may be achieved.

In another aspect, the first circuit is configured to have a first sensitivity or gain in generating the first signal from the input signal. In another aspect, the second circuit is configured to have a second sensitivity or gain in generating the second signal from the input signal, wherein the second sensitivity or gain of the second circuit is different than the first sensitivity or gain of the first circuit. Additionally, in another aspect, the first circuit may be configured to have a first compression point or threshold, and the second circuit is configured to have a second compression point or threshold that is different from the first compression point or threshold of the first circuit.

In yet another aspect, the apparatus comprises a fourth circuit for adjusting the first and/or second dynamic ranges of the first and second circuits, respectively. In another aspect, the fourth circuit is adapted to generate a reference voltage or current for the first and/or the second circuits, respectively. The reference voltage or current adjust the dynamic range characteristic of the first and/or second circuits. In another aspect, the fourth circuit comprises a programmable reference level device adapted to generate the first or second reference voltage.

In yet another aspect, the first or second circuit may comprise an envelope detector, a squaring device, a differential transistor pair, or a differential amplifier. In another aspect, the first circuit comprises a first transistor pair with transistors of a first size, and the second circuit comprises a second transistor pair with transistors of a second size different than the first size of the transistors of the first transistor pair. In still another aspect, the apparatus comprises first and second current sources adapted to provide first and second reference currents for the first and second transistor pair. In also another aspect, the first or second circuit is adapted to have a fractional bandwidth on the order of 20% or more, a bandwidth on the order of 500 MHz or more, or a fractional bandwidth on the order of 20% or more and a bandwidth on the order of 500 MHz or more.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect comprise at least one element of a claim.

As an example of some of the above concepts, in some aspects, the disclosure relates to an apparatus configured as a compandor to achieve a specified dynamic range for an output signal in response to an input signal dynamic range. In particular, the apparatus comprises a first circuit adapted to generate a first signal from the input signal, wherein the first signal includes a first dynamic range (e.g., a first sensitivity and first compression point); and a second circuit adapted to generate a second signal from the input signal, wherein the second signal includes a second dynamic range (e.g., a second sensitivity and second compression point) that is different from the first dynamic range of the first signal. The apparatus may further comprise a third circuit adapted to generate an output signal related to a sum of the first and second signals. By adjusting the first and second dynamic ranges, an overall dynamic range for the output signal of the companding apparatus may be achieved.

Figure 1:
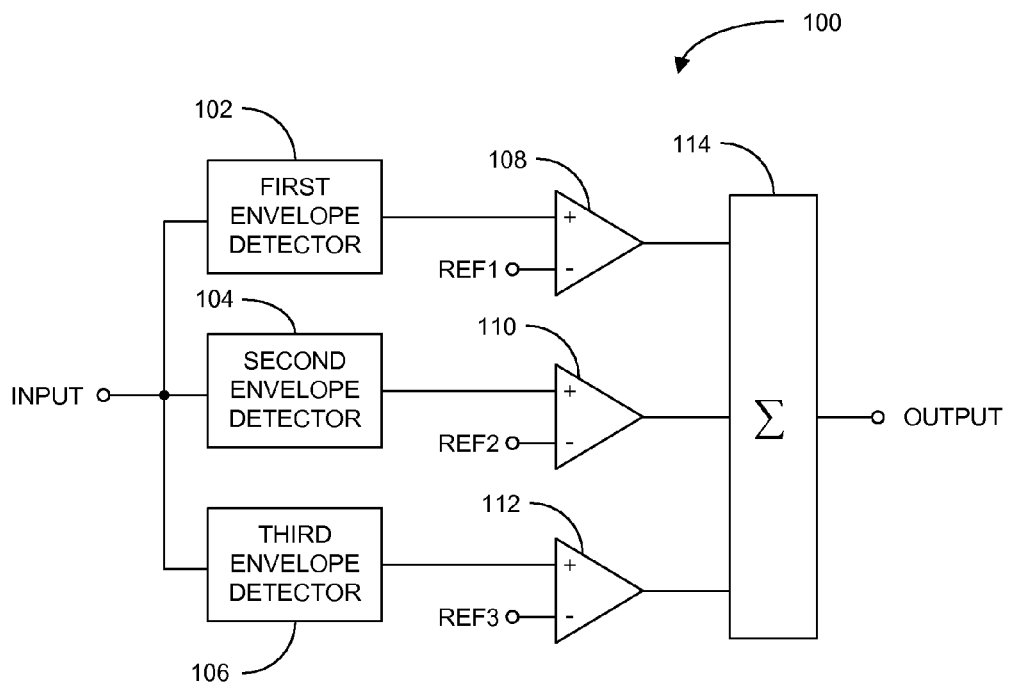
FIG. 1 illustrates a block diagram of an exemplary compandor in accordance with an aspect of the disclosure.

FIG. 1 illustrates a block diagram of an exemplary compandor 100 in accordance with an aspect of the disclosure. In summary, the compandor 100 includes a plurality of non-linear devices, such as envelope detectors, which are each configured to have distinct sensitivities and compression points. The compression points are spaced apart at increasing levels of input signal. In this manner, at a low input power level, all of the envelope detectors (e.g., all three detectors) may be operating to substantially square or detect the input signal. At a medium input power level, only a portion of the envelope detectors (e.g., two detectors) may be operating to substantially square or detect the input signal. And, at a high input power level, only one of the envelope detectors may operate to square or square the input signal. The envelope detectors may have distinct sensitivities in order to achieve a specified dynamic range for the output signal of the compandor 100.

In particular, the compandor 100 comprises a first envelope detector 102, a second envelope detector 104, and a third envelope detector 106, a first differential amplifier 108, a second differential amplifier 110, a third differential amplifier 112, and a summing device 114. The envelope detectors 102, 104, and 106 have inputs coupled together, and adapted to receive an input signal. The first, second, and third envelope detectors 102, 104, and 106 have respective outputs coupled to the positive inputs of the first, second, and third differential amplifiers 108, 110, and 112. Reference voltages REF1, REF2, and REF3 are applied respectively to the negative inputs of the differential amplifiers 108, 110, and 112. The outputs of the differential amplifiers 108, 110, and 112 are coupled to inputs of the summing device 114. The output signal of the compandor 100 is generated at an output of the summing device 114.

As previously discussed, the envelope detectors 102, 104, and 106 may be configured to have distinct dynamic ranges, e.g., distinct sensitivities and compression points. For example, the first envelope detector 102 may be configured to have a relatively high sensitivity and a relatively low compression point. The second envelope detector 104 may be configured to have a medium sensitivity and medium compression point. The third envelope detector 106 may have a relatively low sensitivity and a relatively high compression point.

In this configuration, at a relatively low power level of the input RF signal, the additive sensitivities of the envelope detectors 102, 104, and 106 including the relatively high sensitivity of the first envelope detector 102 helps to detect the relatively low power level of the input signal. At a medium power level of the input RF signal, the first envelope detector 102 may be in compression, and does not significantly contribute to the sensitivity of the compandor 100. Thus, in the medium input power range, the overall sensitivity of the compandor 100 is lower than its sensitivity in the low power range. This allows the medium power level signal to be detected, while preventing devices downstream from going into compression. At a relatively high power level of the input RF signal, both the first and second envelope detectors 102 and 104 may be in compression, and do not significantly contribute to the overall sensitivity of the compandor 100. Thus, in the high input power range, the overall sensitivity of the compandor is relatively low. This prevents devices downstream from going into compression.

The reference voltages REF1-3 applied respectively to the negative inputs of the differential amplifiers 108, 110, and 112 allow for adjustment of the dynamic characteristic of the output of the compandor 100. For instance, adjustment of any of the reference voltages applied to the negative input of the differential amplifier effectively causes a change in the sensitivity and compression point of the corresponding processing segment (e.g., the envelope detector and corresponding differential amplifier). This is explained in more detail as follows.

Figure 2:
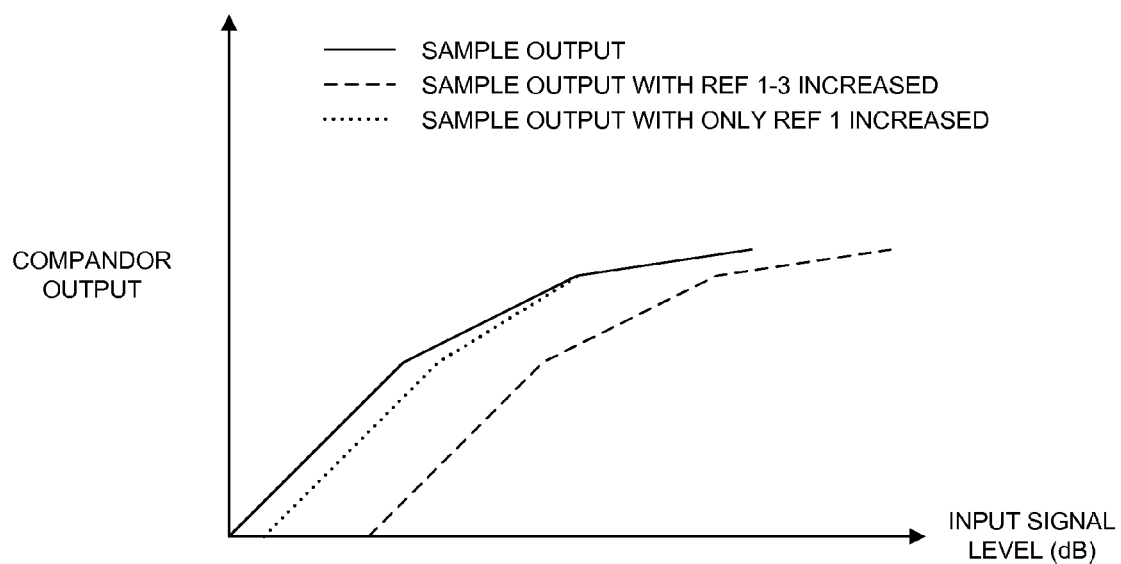
FIG. 2 illustrates a graph of an exemplary input-output response of the exemplary compandor in accordance with another aspect of the disclosure.

FIG. 2 illustrates a graph of an exemplary input-output response of the exemplary compandor 100 in accordance with another aspect of the disclosure. The x- or horizontal axis of the graph represents the power level in dB of the input signal to the compandor 100. The y- or vertical axis represents the output of the compandor 100, which could be in terms of a voltage or a current. Three (3) exemplary responses are shown on the graph. The first response, shown as a solid line, may represent a typical input-output response of the compandor 100. As noted, the first response includes three segments having distinct sensitivities: a high sensitivity at low input signal levels, a medium sensitivity at medium input signal levels, and a low sensitivity at high input signal levels.

The second response, shown as a dashed line, represents the input-output response of the compandor 100 in response to an equal increase in all of the reference voltages REF 1-3. As noted, the effect of equally increasing all of the reference voltages is a rightward shift of the input-output response. This, in effect, reduces the overall sensitivity of the compandor 100. Conversely, a reduction of all of the reference voltages would result in a leftward shift of the input-output response, thereby increasing the overall sensitivity of the compandor 100.

The third response, shown as a dotted line, represents the input-output response of the compandor 100 in response to an increase in only reference voltage REF 1 as applied to the negative input of the differential amplifier 108. As noted, the effect on only increasing reference voltage REF 1 is a rightward shift of the lower segment including the first compression point of the input-output response of the compandor 100. Conversely, a decrease in only the reference voltage REF 1 would result in a leftward shift of the lower segment of the input-output response. Each reference voltage REF 1-3 may be adjusted independently of each other, in order to achieve a specified input-output response for the compandor 100.

Figure 3:
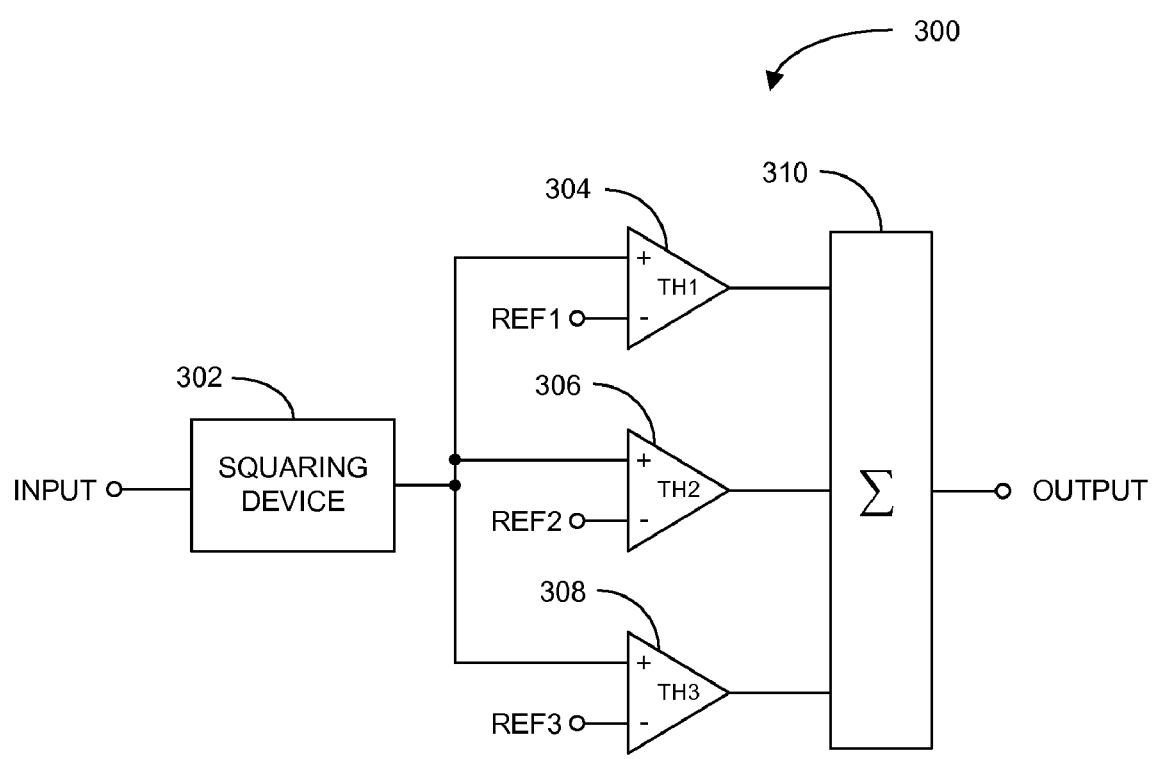
FIG. 3 illustrates a block diagram of another exemplary compandor in accordance with another aspect of the disclosure.

FIG. 3 illustrates a block diagram of another exemplary compandor 300 in accordance with another aspect of the disclosure. In summary, the compandor 300 operates similarly to the previously-discussed compandor 100 in that it includes a plurality of parallel devices having distinct and specified sensitivities and compression points such that a specified dynamic range for the output signal of the compandor 300 is achieved.

In particular, the compandor 300 comprises a non-linear or substantially squaring device 302, a first differential amplifier 304, a second differential amplifier 306, a third differential amplifier 308, and a summing device 310. The squaring device 302 includes an input adapted to receive an input signal, and an output coupled to the positive inputs of the differential amplifiers 304, 306, and 308. Reference voltages REF 1-3 are applied respectively to the negative inputs of the differential amplifiers 304, 306, and 308. The outputs of the differential amplifiers 304, 306, and 308 are coupled to respective inputs of the summing device 310. The output RF signal of the compandor 300 is generated at an output of the summing device 310.

The differential amplifiers 304, 306, and 308 may be configured to have distinct gains (sensitivities) and threshold points (compression points). For example, the first differential amplifier 304 may be configured to have a relatively high gain and a relatively low threshold point. The second differential amplifier 306 may be configured to have a medium gain and medium threshold point. The third differential amplifier 308 may have a relatively low sensitivity and a relatively high compression point.

Similar to the prior aspect, at a relatively low power level of the input RF signal, the additive gains of the differential amplifiers 304, 306, and 308 including the relatively high gain of the first differential amplifier 304 helps to detect the relatively low power level of the input signal. At a medium power level of the input RF signal, the first differential amplifier 304 may be in compression, and does not significantly contribute to the gain of the compandor 300. Thus, in the medium input power range, the overall gain of the compandor 300 is lower than the gain in the low power range. This allows the medium power level signal to be detected, while preventing devices downstream from going into compression. At a relatively high power level of the input signal, both the first and second differential amplifiers 304 and 306 may be in compression, and do not significantly contribute to the overall gain of the compandor 300. Thus, in the high input power range, the overall gain of the compandor is relatively low. This prevents devices downstream from going into compression.

Also, similar to the prior aspect, the reference voltages REF1-3 applied respectively to the negative inputs of the differential amplifiers 304, 306, and 308 allow for adjustment of the dynamic characteristic of the output of the compandor 300. For instance, adjustment of any of the reference voltages applied to the negative input of the differential amplifier effectively causes a change in the corresponding dynamic range, as previously discussed in connection with the prior aspect.

Figure 4:
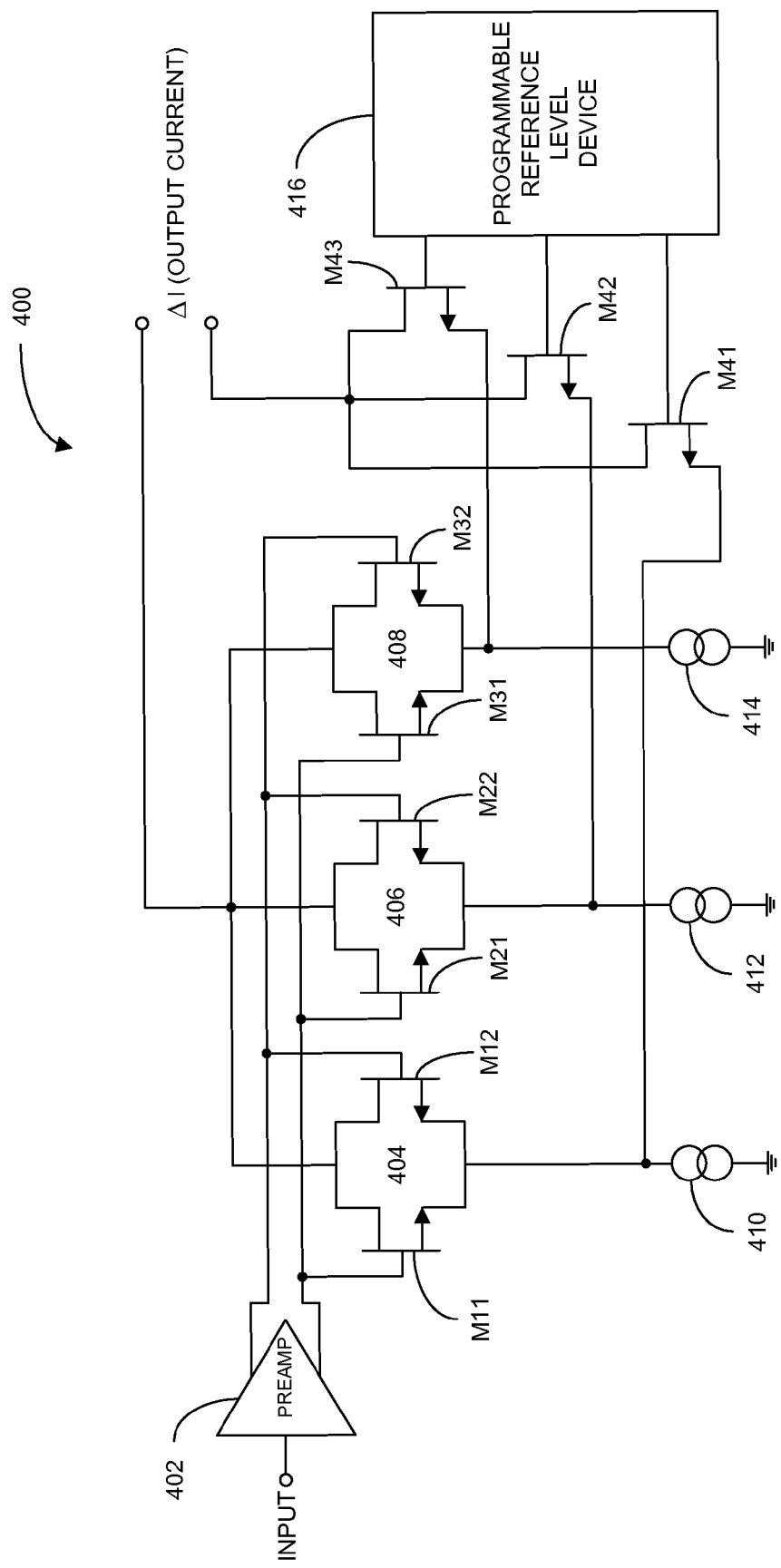
FIG. 4 illustrates a block diagram of yet another exemplary compandor in accordance with another aspect of the disclosure.

FIG. 4 illustrates a block diagram of yet another exemplary compandor 400 in accordance with another aspect of the disclosure. In summary, the compandor 400 includes a plurality of differential transistor pairs configured respectively as non-linear or substantially squaring devices, and a programmable reference voltage device for setting up respective source voltages for the differential transistor pairs. The differential transistor pairs may be set up with different sensitivities and compression points to achieve a desired dynamic range for the output of the compandor 400. Additionally, the programmable reference voltage device may be configured to generate source voltages for the respective differential transistor pairs to provide adjustment to the dynamic range of the output of the compandor 400.

In particular, the compandor 400 comprises a pre-amplifier 402, a plurality of non-linear or substantially squaring devices configured as differential transistor pairs 404, 406, and 408, a plurality of current sources 410, 412, and 414, a plurality of reference voltage transistors M41, M42, and M43, and a programmable reference level device 416. The pre-amplifier 402 includes an input adapted to receive an input RF signal, and differential outputs coupled to the gates of each differential transistor pairs 404, 406, and 408. The differential transistor pairs 404, 406, and 408 include respectively a first differential transistor (M11, M21, and M31) and a second differential transistor (M12, M22, and M32). The current sources 410, 412, and 414 are coupled between the respective sources of the differential transistor pairs 404, 406, and 408, and Vss potential rail, which may be at ground potential.

The programmable reference level device 416 includes outputs coupled to the gates of transistors M41, M42, and M43. The sources of transistors M41, M42, and M43 are respectively coupled to the sources of the differential transistor pairs 404, 406, and 408. The output of the compandor 400 is taken as a differential current $\Delta I$ between the drains of the differential transistor pairs 404, 406, and 408, and the drains of the reference voltage transistors M41, M42, and M43.

The differential transistor pairs 404, 406, and 408 may be configured to have distinct sensitivities and compression points. For instance, by scaling the width to length aspect ratio of the transistors in each differential transistor pair, compression break points can be achieved across the dynamic range of the output of the compandor 400. As an example, the first differential transistor pair 404 may be configured to have a relatively high sensitivity and a relatively low compression point. The second differential transistor pair 406 may be configured to have a medium sensitivity and medium compression point. The third differential transistor pair 406 may have a relatively low sensitivity and a relatively high compression point.

Similar to the prior aspects, at a relatively low power level of the input RF signal, the additive sensitivities of the differential transistor pairs 404, 406, and 408 including the relatively high gain of the first differential transistor pair 404 helps to detect the relatively low power level of the input signal. At a medium power level of the input RF signal, the first differential transistor pair 404 may be in compression, and does not significantly contribute to the overall sensitivity of the compandor 400. Thus, in the medium input power range, the overall sensitivity of the compandor 400 is lower than the sensitivity in the low power range. This allows the medium power level signal to be detected, while preventing devices downstream from going into compression. At a relatively high power level of the input RF signal, both the first and second differential transistor pairs 404 and 406 may be in compression, and do not significantly contribute to the overall sensitivity of the compandor 400. Thus, in the high input power range, the overall sensitivity of the compandor is relatively low. This prevents devices downstream from going into compression.

Also, similar to the prior aspects, the reference voltages REF1-3 applied respectively to the sources of the differential transistor pairs 404, 406, and 408 allow for adjustment of the dynamic characteristic of the output of the compandor 400. For instance, adjustment of any of the reference voltages applied to the source of the corresponding differential transistor effectively causes a change in the sensitivity and compression, as previously discussed in connection with the prior aspects.

Figure 5:
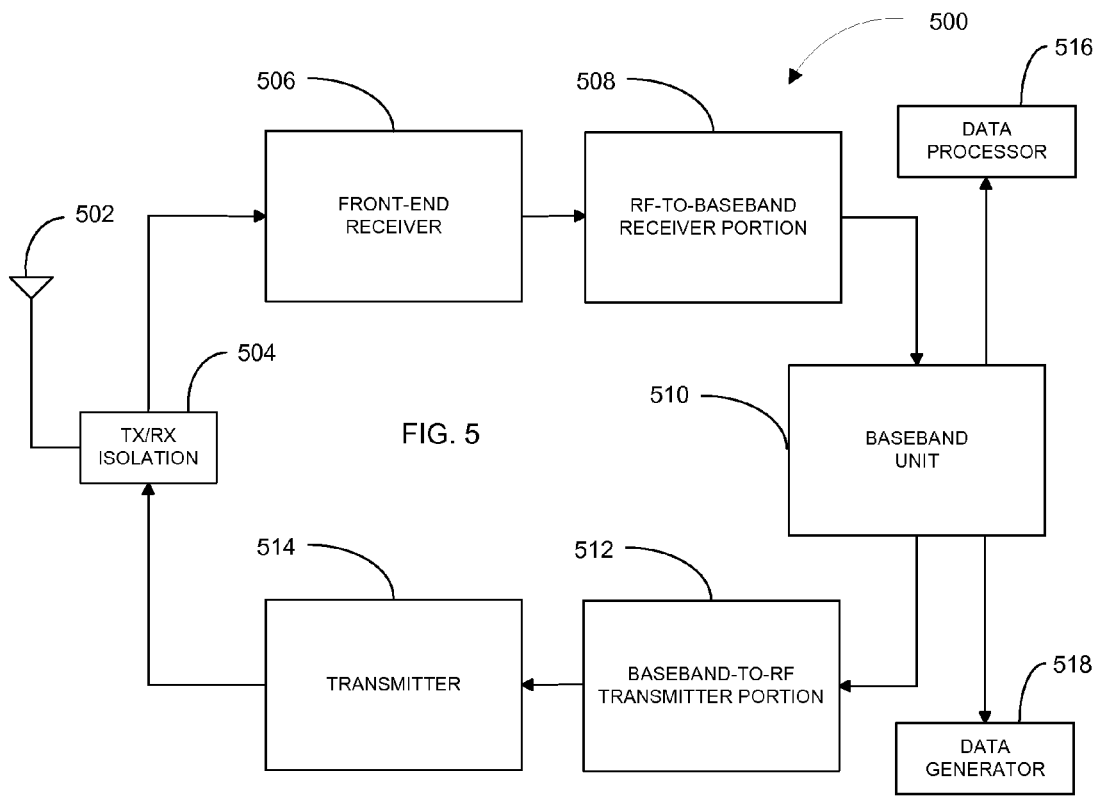
FIG. 5 illustrates a block diagram of an exemplary communications device in accordance with another aspect of the disclosure.

FIG. 5 illustrates a block diagram of an exemplary communications device 500 including an exemplary receiver in accordance with another aspect of the disclosure. The communications device 500 may be particularly suited for sending and receiving data to and from other communications devices. The communications device 500 comprises an antenna 502, a Tx/Rx isolation device 504, a front-end receiver portion 506, an RF-to-baseband receiver portion 508, a baseband unit 510, a baseband-to-RF transmitter portion 512, a transmitter 514, a data receiver 516, and a data generator 518. The receiver 506 may be configured to include at least some of the components of the compandors previously discussed.

In operation, the data processor 516 may receive data from a remote communications device via the antenna 502 which picks up the RF signal from the remote communications device, the Tx/Rx isolation device 504 which sends the signal to the front-end receiver portion 506, the receiver front-end 506 which amplifies the received signal, the RF-to-baseband receiver portion 508 which converts the RF signal into a baseband signal, and the baseband unit 510 which processes the baseband signal to determine the received data. The data receiver 516 may then perform one or more defined operations based on the received data. For example, the data processor 516 may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), etc.

Further, in operation, the data generator 518 may generate outgoing data for transmission to another communications device via the baseband unit 510 which processes the outgoing data into a baseband signal for transmission, the baseband-to-RF transmitter portion 512 which converts the baseband signal into an RF signal, the transmitter 514 which conditions the RF signal for transmission via the wireless medium, the Tx/Rx isolation device 504 which routes the RF signal to the antenna 502 while isolating the input to the receiver front-end 506, and the antenna 502 which radiates the RF signal to the wireless medium. The data generator 518 may be a sensor or other type of data generator. For example, the data generator 518 may include a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a display, one or more light emitting diodes (LED), etc.

Figure 6:
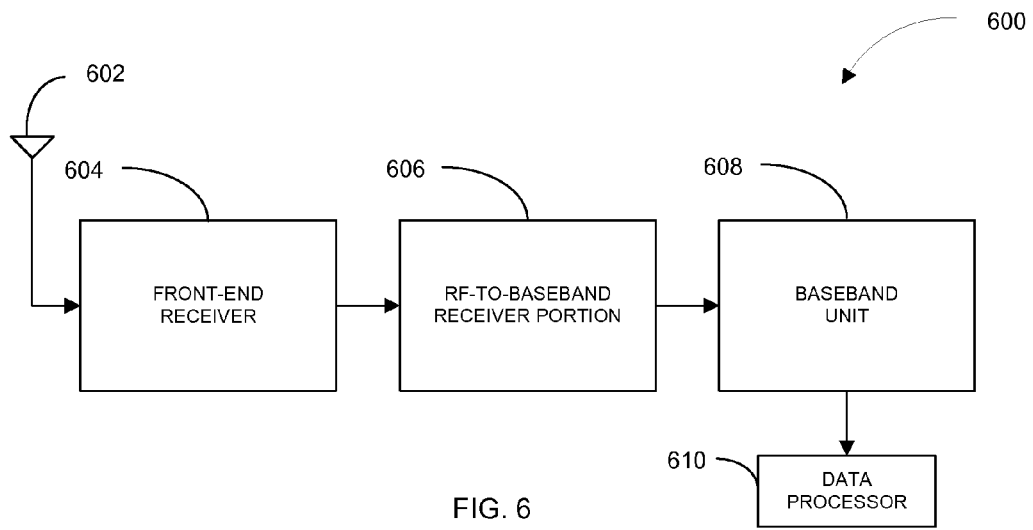
FIG. 6 illustrates a block diagram of another exemplary communications device in accordance with another aspect of the invention.

FIG. 6 illustrates a block diagram of an exemplary communications device 600 including an exemplary receiver in accordance with another aspect of the disclosure. The communications device 600 may be particularly suited for receiving data from other communications devices. The communications device 600 comprises an antenna 602, a front-end receiver 604, an RF-to-baseband transmitter portion 606, a baseband unit 608, and a data receiver 610. The receiver 604 may be configured to include at least some of the components of the compandors previously discussed.

In operation, the data processor 610 may receive data from a remote communications device via the antenna 602 which picks up the RF signal from the remote communications device, the receiver front-end 604 which amplifies the received signal, the RF-to-baseband receiver portion 606 which converts the RF signal into a baseband signal, and the baseband unit 608 which processes the baseband signal to determine the received data. The data receiver 610 may then perform one or more defined operations based on the received data. For example, the data processor 610 may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), etc.

Figure 7A:
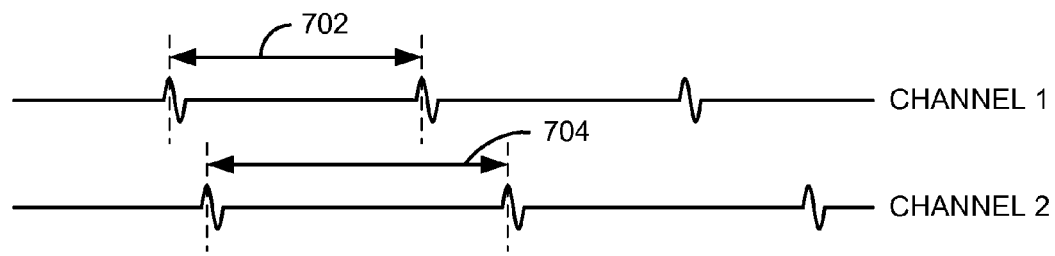
FIGS. 7A-D illustrate timing diagrams of various pulse modulation techniques in accordance with another aspect of the disclosure.

FIG. 7A illustrates different channels (channels 1 and 2) defined with different pulse repetition frequencies (PRF) as an example of a pulse modulation that may be employed in any of the communications systems described herein. Specifically, pulses for channel 1 have a pulse repetition frequency (PRF) corresponding to a pulse-to-pulse delay period 702. Conversely, pulses for channel 2 have a pulse repetition frequency (PRF) corresponding to a pulse-to-pulse delay period 704. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF). Conversely, a channel supporting relatively high data rates (e.g., on the order of a several megabits per second or Mbps) may employ a correspondingly higher pulse repetition frequency (PRF).

Figure 7B:
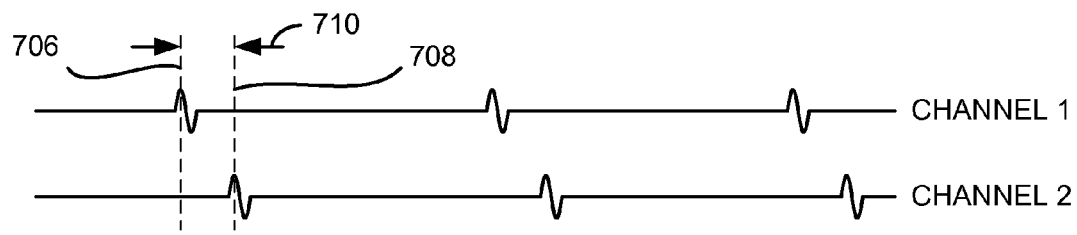

FIG. 7B illustrates different channels (channels 1 and 2) defined with different pulse positions or offsets as an example of a modulation that may be employed in any of the communications systems described herein. Pulses for channel 1 are generated at a point in time as represented by line 706 in accordance with a first pulse offset (e.g., with respect to a given point in time, not shown). Conversely, pulses for channel 2 are generated at a point in time as represented by line 708 in accordance with a second pulse offset. Given the pulse offset difference between the pulses (as represented by the arrows 710), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 7C:
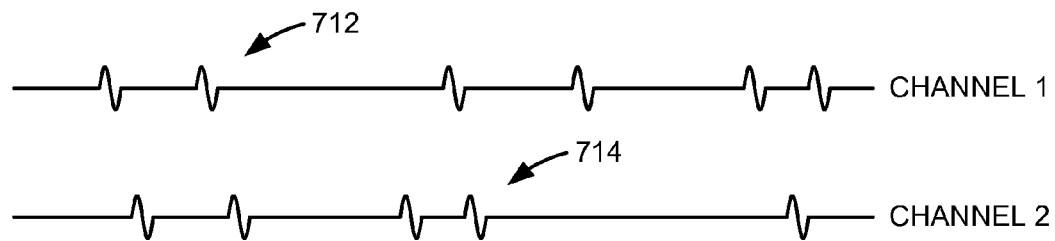

FIG. 7C illustrates different channels (channels 1 and 2) defined with different timing hopping sequences modulation that may be employed in any of the communications systems described herein. For example, pulses 712 for channel 1 may be generated at times in accordance with one time hopping sequence while pulses 714 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 7D:
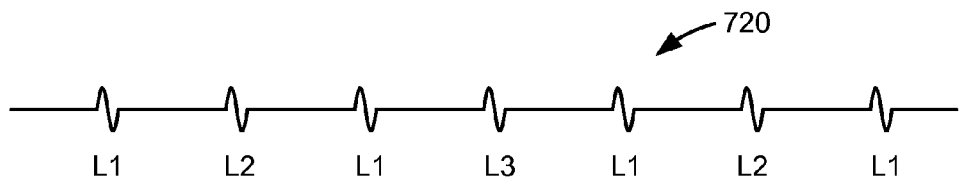

FIG. 7D illustrates different channels defined with different time slots as an example of a pulse modulation that may be employed in any of the communications systems described herein. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 8:
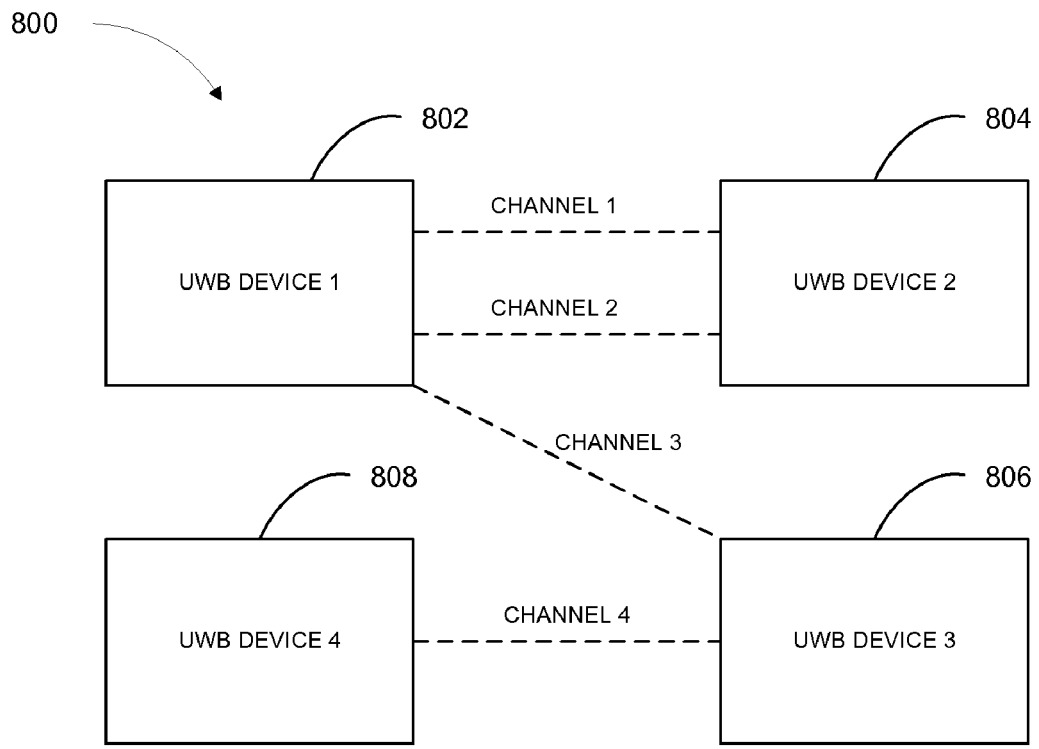
FIG. 8 illustrates a block diagram of various communications devices communicating with each other via various channels in accordance with another aspect of the disclosure.

FIG. 8 illustrates a block diagram of various ultra-wide band (UWB) communications devices communicating with each other via various channels in accordance with another aspect of the disclosure. For example, UWB device 1 802 is communicating with UWB device 2 804 via two concurrent UWB channels 1 and 2. UWB device 802 is communicating with UWB device 3 806 via a single channel 3. And, UWB device 3 806 is, in turn, communicating with UWB device 4 808 via a single channel 4. Other configurations are possible. The communications devices may be used for many different applications, and may be implemented, for example, in a headset, microphone, biometric sensor, heart rate monitor, pedometer, EKG device, watch, shoe, remote control, switch, tire pressure monitor, or other communications devices.

Figure 9:
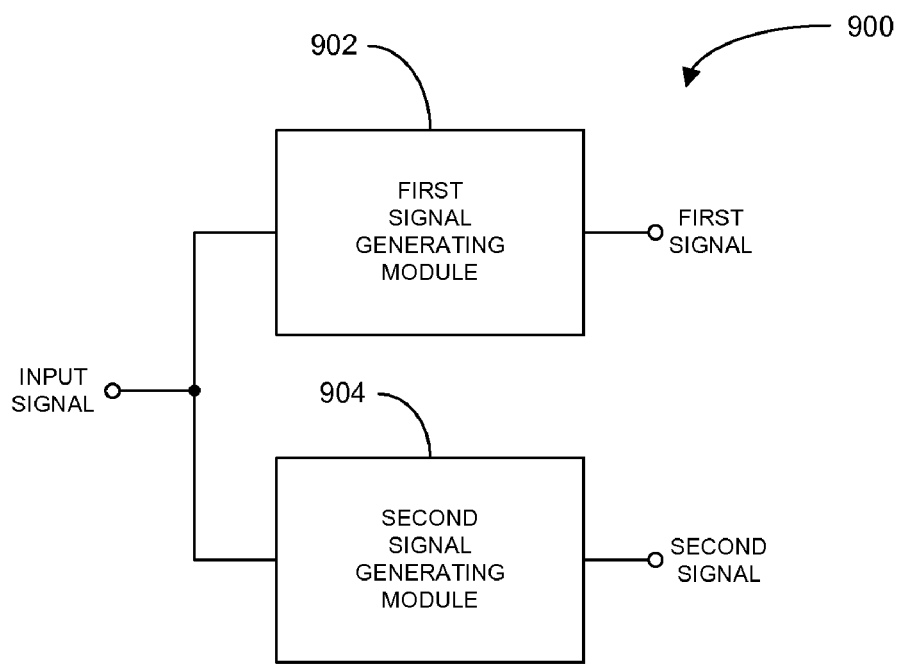
FIG. 9 illustrates a block diagram of another exemplary compandor in accordance with another aspect of the disclosure.

FIG. 9 illustrates a block diagram of another exemplary compandor 900 in accordance with another aspect of the disclosure. The compandor 900 comprises a first signal generating module 902 adapted to generate a first signal from an input signal, wherein the first signal has a first dynamic range. The compandor 900 further comprises a second signal generating module 904 adapted to generate a second signal from the input signal, wherein the second signal has a second dynamic range that is different from the first dynamic range.

Any of the above aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitude of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A method of processing an input signal, comprising:
   generating a first signal from the input signal, wherein the first signal has a first dynamic range; and
   generating a second signal from the input signal, wherein the second signal has a second dynamic range that is different from the first dynamic range of the first signal,
   wherein generating the first signal comprises detecting the input signal with a first sensitivity or gain to generate the first signal, and
   wherein generating the first signal comprises generating the first signal not substantially beyond a first compression or threshold level.

2. The method of claim 1, further comprising combining the first and second signals to generate a third signal.

3. The method of claim 1, wherein the first signal is non-linearly related to the input signal.

4. The method of claim 1, wherein generating the second signal comprises detecting the input signal with a second sensitivity or gain to generate the second signal, and further wherein the second sensitivity or gain is different than the first sensitivity or gain.

5. The method of claim 1, wherein generating the second signal comprises generating the second signal not substantially beyond a second compression or threshold level, and further wherein the second compression or threshold level is different than the first compression or threshold level.

6. The method of claim 1, further comprising adjusting the first or second dynamic range.

7. The method of claim 6, wherein adjusting the first or second dynamic range comprises generating a reference voltage or current, respectively.

8. The method of claim 7, wherein generating the reference voltage or current comprises activating a programmable reference level device.

9. The method of claim 1, wherein generating the first or second signal comprises envelope detecting or substantially squaring the input signal.

10. The method of claim 1, wherein generating the first signal comprises applying the input signal to a first transistor pair with transistors of a first size, and further wherein generating the second signal comprises applying the input signal to a second transistor pair with transistors of a second size different than the first size of the transistors of the first transistor pair.

11. The method of claim 10, further comprising providing first and second reference currents for the first and second transistor pairs.

12. An apparatus, comprising:
   a first means for generating a first signal from an input signal, wherein the first signal has a first dynamic range; and
   a second means for generating a second signal from the input signal, wherein the second signal has a second dynamic range that is different from the first dynamic range of the first signal,
   wherein the first generating means is configured to have a first sensitivity or gain in generating the first signal from the input signal; and
   wherein the first generating means is configured to have a first compression point or threshold.

13. The apparatus of claim 12, further comprising means for combining the first and second signals to generate a third signal.

14. The apparatus of claim 12, wherein the first signal is non-linearly related to the input signal.

15. The apparatus of claim 12, wherein the second generating means is configured to have a second sensitivity or gain in generating the second signal from the input signal, and further wherein the second sensitivity or gain of the second generating means is different than the first sensitivity or gain of the first generating means.

16. The apparatus of claim 12, wherein the second generating means is configured to have a second compression point or threshold, and further wherein the second compression point of threshold of the second generating means is different than the first compression point or threshold of the first generating means.

17. The apparatus of claim 12, further comprising a means for adjusting the first or second dynamic range.

18. The apparatus of claim 12, wherein the dynamic range adjusting means is adapted to provide a reference voltage or current to the first or second generating means, respectively.

19. The apparatus of claim 18, wherein the dynamic range adjusting means comprises a programmable reference level device adapted to generate the reference voltage or current.

20. The apparatus of claim 12, wherein the first or second generating means comprises an envelope detector, a squaring device, a differential transistor pair, or a differential amplifier.

21. The apparatus of claim 12, wherein the first generating means comprises a first transistor pair with transistors of a first size, and further wherein the second generating means comprises a second transistor pair with transistors of a second size different than the first size of the transistors of the first transistor pair.

22. The apparatus of claim 21, further comprising means for generating first and second reference currents for the first and second transistor pairs.

23. The apparatus of claim 12, wherein the first or second generating means is adapted to have a fractional bandwidth on the order of 20% or more, a bandwidth on the order of 500 MHz or more, or a fractional bandwidth on the order of 20% or more and a bandwidth on the order of 500 MHz or more.

24. An apparatus, comprising:
a first circuit adapted to generate a first signal from an input signal, wherein the first signal has a first dynamic range; and
a second circuit adapted to generate a second signal from the input signal, wherein the second signal has a second dynamic range that is different from the first dynamic range of the first signal,
wherein the first circuit is configured to have a first sensitivity or gain in generating the first signal from the input signal; and wherein the first circuit is configured to have a first compression point or threshold.

25. The apparatus of claim 24, further comprising a third circuit adapted to generate a third signal related to a sum of the first and second signals.

26. The apparatus of claim 24, wherein the first signal is non-linearly related to the input signal.

27. The apparatus of claim 24, wherein the second circuit is configured to have a second sensitivity or gain in generating the second signal from the input signal, and further wherein the second sensitivity or gain of the second circuit is different than the first sensitivity or gain of the first circuit.

28. The apparatus of claim 24, wherein the second circuit is configured to have a second compression point or threshold, and further wherein the second compression point or threshold of the second circuit is different than the first compression point or threshold of the first circuit.

29. The apparatus of claim 24, further comprising a third circuit for adjusting the first or second dynamic range.

30. The apparatus of claim 29, wherein the third circuit is adapted to provide a reference voltage or current to the first or second circuit.

31. The apparatus of claim 30, wherein the third circuit comprises a programmable reference level device adapted to generate the reference voltage or current.

32. The apparatus of claim 24, wherein the first or second circuit comprises an envelope detector, a squaring device, a differential transistor pair, or a differential amplifier.

33. The apparatus of claim 24, wherein the first circuit comprises a first transistor pair with transistors having a first size, and further wherein the second circuit comprises a second transistor pair with transistors having a second size different than the first size of the transistors of the first transistor pair.

34. The apparatus of claim 32, further comprising first and second current sources adapted to provide first and second reference currents for the first and second transistor pairs.

* * * * *